United States Patent [19]
Nilssen

[11] Patent Number: 5,432,409
[45] Date of Patent: * Jul. 11, 1995

[54] ELECTRONIC BALLAST WITH PARALLEL-TUNED OUTPUT CIRCUIT

[76] Inventor: Ole K. Nilssen, 408 Caesar Dr., Barrington, Ill. 60010

[*] Notice: The portion of the term of this patent subsequent to Sep. 18, 2004 has been disclaimed.

[21] Appl. No.: 196,812

[22] Filed: Feb. 2, 1994

Related U.S. Application Data

[63] Continuation of Ser. No. 5,381, Jan. 15, 1993, abandoned, which is a continuation of Ser. No. 840,528, Feb. 25, 1992, Pat. No. 5,189,342, which is a continuation of Ser. No. 646,497, Jan. 28, 1991, which is a continuation of Ser. No. 107,795, Oct. 13, 1987, abandoned, which is a continuation-in-part of Ser. No. 658,423, Oct. 5, 1984, abandoned, which is a continuation-in-part of Ser. No. 555,426, Nov. 23, 1983, abandoned, which is a continuation of Ser. No. 178,107, Aug. 14, 1980, abandoned, which is a continuation-in-part of Ser. No. 973,741, Dec. 28, 1978, abandoned, which is a continuation-in-part of Ser. No. 890,586, Mar. 20, 1978, Pat. No. 4,184,128.

[51] Int. Cl.⁶ ............................................. H05B 41/29
[52] U.S. Cl. ............................... 315/209 R; 315/226; 315/DIG. 5
[58] Field of Search ............... 315/209 R, 243, 244, 315/226, DIG. 5, DIG. 7; 363/17, 58, 132

[56] References Cited

U.S. PATENT DOCUMENTS

| 3,155,875 | 11/1964 | Wenrich et al. | 315/DIG. 5 X |
| 3,340,458 | 9/1967 | Keller | 333/177 X |
| 3,341,737 | 9/1967 | Rosa | 315/209 R |
| 3,800,210 | 3/1974 | Caussin | 333/177 X |
| 4,277,726 | 7/1981 | Burke | 315/98 |
| 4,307,353 | 12/1981 | Nilssen | 331/113 A |
| 4,346,332 | 8/1982 | Walden | 315/224 X |
| 4,370,600 | 1/1983 | Zansky | 315/209 R X |
| 4,392,087 | 7/1983 | Zansky | 315/219 |
| 4,463,286 | 7/1984 | Justice | 315/219 |
| 4,469,988 | 9/1984 | Cronin | 315/DIG. 5 X |
| 4,692,667 | 9/1987 | Nilssen | 315/209 R |
| 5,189,342 | 2/1993 | Nilssen | 315/209 R |

Primary Examiner—David Mis

[57] ABSTRACT

Power to a self-oscillating inverter ballast is supplied from a DC voltage source through an inductor means having two separate windings on a common magnetic core—with one winding being positioned in each leg of the power supply. The inverter is loaded by way of a parallel-tuned L-C circuit connected across the inverter's output, thereby providing a sinusoidal voltage thereat. A fluorescent lamp is connected by way of a current-limiting capacitor with the inverter's output.

38 Claims, 1 Drawing Sheet

ELECTRONIC BALLAST WITH PARALLEL-TUNED OUTPUT CIRCUIT

RELATED APPLICATIONS

This is a continuation of Ser. No. 08/005,381 filed Jan. 15, 1993, now abandoned, which is a continuation of Ser. No. 07/840,528 filed Feb. 25, 1992, now U.S. Pat. No. 5,189,342; which is a continuation of Ser. No. 07/646,497 filed Jan. 28, 1991, which is a continuation of Ser. No. 07/107,795 filed Oct. 13, 1987, now abandoned; which is a continuation-in-part of Ser. No. 06/658,423 filed Oct. 05, 1984, now abandoned; which is a continuation-in-part of Ser. No. 06/555,426 filed Nov. 23, 1983 now abandoned; which is a continuation of Ser. No. 06/178,107 filed Aug. 14, 1980 now abandoned; which is a continuation-in-part of Ser. No. 05/973,741 filed Dec. 28, 1978, now abandoned; which is a continuation-in-part of Ser. No. 05/890,586 filed Mar. 20, 1978, now U.S. Pat. No. 4,184,128.

BACKGROUND OF THE INVENTION

1. Field of Invention

The present invention relates to a self-oscillating parallel-tuned transistor inverter ballast, particularly of a kind that comprises bridge-type inverter means.

2. Description of Prior Art

Although self-oscillating parallel-tuned transistor inverter ballasts do presently exist—as for instance described in U.S. Pat. No. 4,277,726 to Burke—bridge-type inverters of that type do not presently exist.

SUMMARY OF THE INVENTION

Objects of the Invention

An object of the present invention is that of providing a self-oscillating inverter ballast for powering a gas discharge lamp means.

Another object is that of providing an inverter ballast that is particularly cost-effective, efficient and versatile in use.

These, as well as other important objects and advantages of the present invention will become apparent from the following description.

Brief Description

In its preferred embodiment, the present invention includes an inverter circuit having a pair of DC input terminals and at least two periodically conducting transistors series-connected between an auxiliary negative terminal and an auxiliary positive terminal. The two transistors are connected together at a junction terminal.

The inverter circuit is powered from a DC voltage source having a pair of DC supply terminals connected with the DC input terminals; which DC input terminals are connected with the auxiliary negative terminal and the auxiliary positive terminal by way of an inductor means having two windings on a single magnetic core.

The inverter circuit includes structure sufficient to cause a substantially sinusoidal high-frequency output voltage to be provided between a pair of output terminals, as well as to cause a substantially sinusoidal high-frequency voltage to exist between the junction terminal and one of the DC supply terminals.

A fluorescent lamp is connected with the output terminals by way of current-limiting circuitry.

DESCRIPTION OF THE PREFERRED EMBODIMENT

Details of Construction

Figure 1:
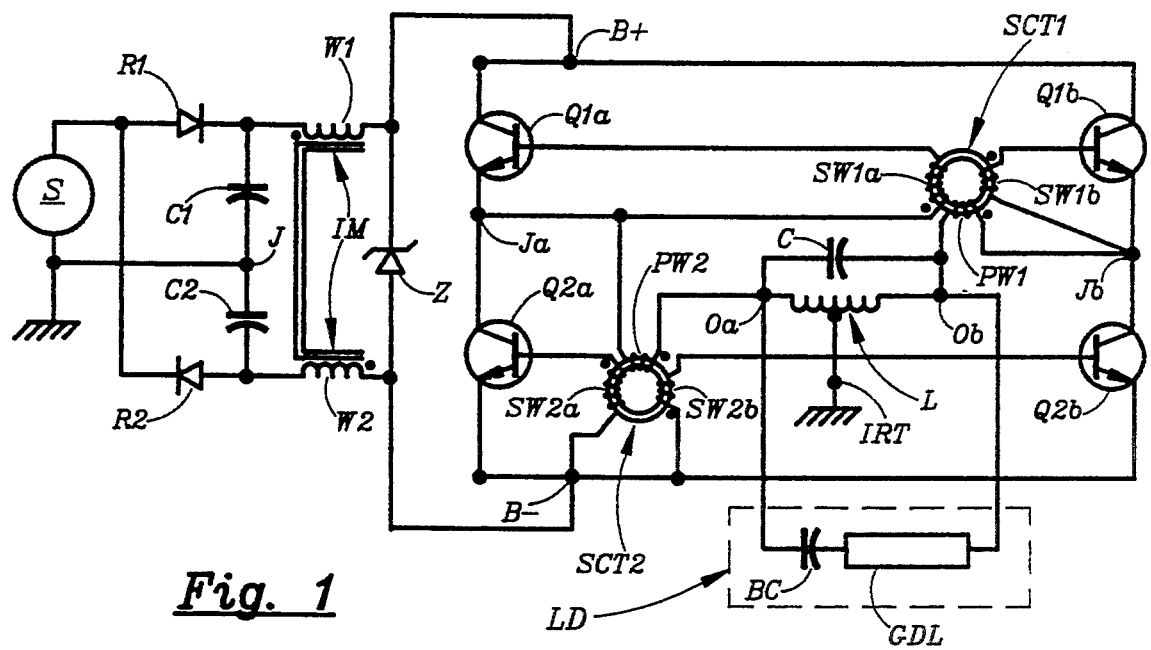
FIG. 1 schematically illustrates the preferred embodiment of the invention.

FIG. 1 shows an AC power supply S, which in reality is an ordinary 120 Volt/60 Hz electric utility power line.

One terminal of power supply S is grounded and also directly connected to a junction J between two energy-storing capacitors C1 and C2. The other terminal of power supply S is connected to the anode of a rectifier R1 and to the cathode of a rectifier R2. Rectifier R1 has its cathode connected to one terminal of C1—the other terminal of C1 being connected to junction J. Rectifier R2 has its anode connected to one terminal of C2—the other terminal of C2 being connected to junction J.

An inductor means IM has two equal but separate windings W1 and W2:W1 is connected between the cathode of rectifier R1 and a junction B+ between the collectors of two transistors Q1a and Q1b; W2 is connected between the anode of R2 and a junction B− between the emitters of two transistors Q2a and Q2b.

A Zener diode Z is connected between junction B+ and junction B−.

Transistor Q1a is connected with its emitter to a junction Ja, as is also the collector of transistor Q2a. Transistor Q1b is connected with its emitter to a junction Jb, as is also the collector of transistor Q2b.

A center-tapped inductor L is connected between inverter output terminals Oa and Ob. Connected in parallel with L is a capacitor C. The center-tap on inductor L, which is referred-to as inverter reference terminal IRT, is grounded.

Primary winding PW1 of saturable current-transformer SCT1 is connected between junction Jb and output terminal Ob. Primary winding PW2 of saturable current-transformer SCT2 is connected between junction Ja and output terminal Oa.

One secondary winding SW1a of transformer SCT1 is connected between the base and the emitter of transistor Q1a; another secondary winding SW1b of transformer SCT1 is connected between the base and the emitter of transistor Q1b.

One secondary winding SW2a of transformer SCT2 is connected between the base and the emitter of transistor Q2a; another secondary winding SW2b of transformer SCT2 is connected between the base and the emitter of transistor Q2b.

A series-combination of a ballasting capacitor CB and a gas discharge lamp GDL constitutes a load LD; which load is connected across output terminals Oa and Ob.

Details of Operation

The operation of the full-bridge inverter circuit of FIG. 1 may be explained as follows.

Source S provides 120 Volt/60 Hz voltage to the voltage-doubling and rectifying/filtering circuit consisting of R1, R2, C1 and C2. A substantially constant DC voltage of about 320 Volt magnitude then results at the output of this circuit, with the positive side of this DC voltage being present at the cathode of R1 and the negative side being present at the anode of R2.

This substantially constant-magnitude DC voltage is applied by way of inductor means IM and its two windings W1 and W2, poled as indicated, to the DC power input terminals B+ and B− of the full-bridge inverter circuit comprising transistors Q1a, Q1b, Q2a and Q2b.

This inverter circuit is made to self-oscillate by way of positive current feedback provided by saturable current-transformers SCT1 and SCT2, poled as indicated. Thus, the magnitude of the current provided to any given transistor's base-emitter junction is proportional to the magnitude of the current flowing between output terminals Oa and Ob.

The frequency of inverter oscillation is determined by a combination of the saturation characteristics of the saturable current-transformers and the natural resonance frequency of the parallel L-C circuit (as combined with any tuning effects caused by the load connected thereacross).

The saturation characteristics of the saturable current-transformers are substantially identical to one another and so chosen that, when there is no load connected across output terminals Oa and Ob, the waveform of the output voltage is as indicated in FIG. 2a; which waveform is made up of sinusoidal half-waves of voltage, indicated by HW1 and HW2, interconnected with periods of zero-magnitude voltage, indicated by ZM1 and ZM2. This waveform is achieved by making the time-length of the saturation-time required for the saturable current-transformers to reach saturation longer than the time-length of one of the sinusoidal half-waves of voltage. The degree to which the time-length of the saturation-time is longer than the time-length of one of the sinusoidal half-waves of voltage corresponds to the time-length of the periods of zero-magnitude voltage.

In FIG. 2a, each of the sinusoidal half-waves of voltage represents the natural interaction between L and C as fed from a substantially constant current source.

In combination, the two separate but equal windings W1 and W2 of inductor means IM provide for a total inductance that is large enough so that the current flowing through the two windings and into the inverter remains substantially constant during a complete time-period of one cycle of the inverter's oscillation.

That is, the DC current flowing into the B+ junction and out of the B− junction is substantially constant during the interval between point X and point Y in FIG. 2a. Thus, whenever the L-C parallel circuit is connected between B+ and B−——which it is during the complete time-length of each of the sinusoidal half-waves of voltage—it is indeed fed from a substantially constant current source.

When a load impedance having a net component of capacitive reactance (such as does LD) is connected across the inverter's output terminals Oa and Ob, capacitive reactance is in effect added to the L-C parallel circuit; which results in the time-lengthening of the sinusoidal half-waves of voltage—as indicated by FIG. 2b. The more capacitance added this way, the more time-lengthening results.

On the other hand, when a load impedance having a net component of inductive reactance is connected between Oa and Ob, the result would be a time-shortening of the sinusoidal half-waves of voltage.

By having two different load impedances connected between Oa and Ob, and by having these two load impedances be of conjugate nature, there will be no net effect on the length of the period of the sinusoidal half-waves. For instance, by having another gas discharge lamp like GDL connected in series with an inductor having a reactance of the same absolute magnitude as that of CB, and by connecting this series-combination in parallel with load LD, the total net load impedance would be resistive and would cause no net shortening or lengthening of the sinusoidal half-waves of voltage.

By making the time-length of the saturation-time of the saturable current-transformers substantially equal to the time-length of one of the sinusoidal half-waves of voltage, the resulting output voltage will be as illustrated in FIG. 2c; which indicates that the net inversion frequency will now be the same as the natural resonance frequency of the L-C parallel circuit (as combined with whatever load impedance might be connected between Oa and Ob).

By making the time-length of the saturation-time of the saturable current-transformers shorter than the time-length of one of the sinusoidal half-waves of voltage, the resulting output voltage will be as illustrated in FIG. 2d; which indicates that the net inversion frequency will now be higher then the natural resonance frequency of the L-C circuit (as combined with whatever load impedance might be connected between Oa and Ob).

Additional Comments (a) As long as the time-length of the saturation-time of the saturable current-transformers remains equal to or longer than the time-length of one of the sinusoidal half-waves of voltage, the net inversion frequency will not be affected by the addition or removal of a load impedance, such as LD of FIG. 1, regardless of the magnitude of the net reactive impedance thereby added to or subtracted from the L-C parallel circuit.

(b) The magnitude of the Zener voltage of Zener diode Z is chosen such as to be somewhat higher than the maximum magnitude of the peak voltage of the sinusoidal half-waves of voltage present across the inverter's output terminals Oa and Ob. That way, the Zener diode will not interfere with normal operation of the inverter; yet, it will prevent the magnitude of the peak voltages of the sinusoidal half-waves from substantially exceeding the normally occurring maximum magnitudes. Without the Zener diode, for various transient reasons (such as due to the sudden removal of a load) the magnitude of the peak voltages of the sinusoidal half-waves would occasionally become substantially larger than the normally occurring maximum magnitudes; and that would either cause transistor destruction, or it would necessitate the use of very special transistors of exceptionally high voltage capabilities.

(c) Inductor L is center-tapped; which, in effect, provides for a center-tap between the inverter's output terminals Oa and Ob. This center-tap is grounded. In many applications, particularly in the case of fluorescent lamp ballasts, it is very valuable to have the output referenced to ground.

(d) Inductor L may be integrally combined with a center-tapped auto-transformer; in which case the output voltage can readily be provided at any desired magnitude, while maintaining a ground-connected center-tap.

(e) Inductor means IM may consist of two entirely independent inductors—with one inductor located in each leg of the power supply. In fact, it is even acceptable under some circumstances to use but a single inductor in just one leg of the power supply; in which case, however, it would not be possible to connect the output's center-tap with the power supply's center-tap.

(f) It is not necessary to power the inverter of FIG. 1 from a voltage doubler. However, doing so provides for the advantage in many situations of being able to reference the center-tap of the inverter's output with one of the legs of the power line.

(g) The inverter of FIG. 1 must be triggered into oscillation. This triggering may be accomplished by way of providing a special trigger winding on each of the feedback current-transformers, and then to discharge a capacitor through these trigger windings. This may be done automatically with an arrangement consisting of a capacitor-resistor combination connected between B+ and B−, and a Diac for discharging the capacitor through the trigger windings.

(h) Finally, it is noted that the average absolute magnitude of the AC voltage appearing between inverter output terminals Oa and Ob must be substantially equal to the magnitude of the DC voltage provided from across the two series-connected energy-storing capacitors C1 and C2.

Or, stated differently, in the circuit of FIG. 1, if the inverter's AC output voltage as provided between terminals Oa and Ob were to be rectified in a full-wave rectifier, the average magnitude of the DC voltage obtained from this full-wave rectifier would have to be substantially equal to the magnitude of the DC voltage supplied from the DC output of the rectifier/filter combination consisting of R1, R2, C1 and C2.

This relationship would have to exist substantially regardless of the nature of the load connected between the inverter's output terminals.

(i) Although the full-bridge inverter circuit of FIG. 1 may be designed to invert at any one of a wide range of frequencies, in the preferred embodiment the inversion frequency is approximately 30 kHz. Thus, the time-length of the interval between point X and point Y of FIG. 2a is about 33 micro-seconds.

Figure 2:
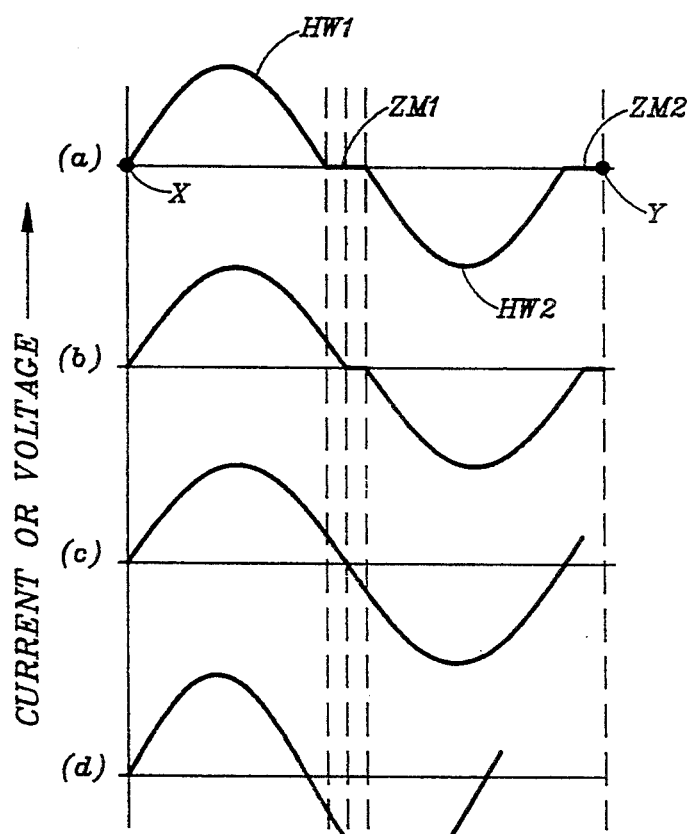
FIG. 2 shows various voltage waveforms associated with the preferred embodiment of the invention.

(j) The waveforms of FIG. 2 depict the voltage present between output terminals Oa and Ob under different operating conditions. Of course, the voltage present between Oa and inverter reference terminal IRT is equal to half the voltage present between terminals Oa and Ob.

(k) Due to the balanced nature of the inverter and its DC power supply, with reference to any one of the terminals of filter capacitors C1 and C2, any high frequency voltage present at inverter reference terminal IRT—even if it were not connected with ground—would have negligible magnitude.

(l) The primary windings of saturable current transformers SCT1 and SCT2 have fewer turns than do the secondary windings. Typically, the transistors operate with a 1:4 primary-to-secondary turns ratio; which corresponds to a forced current gain of four. At that turns ratio, the magnitude of the voltage developing across the primary winding of each of the saturable current transformers is only one fourth of the magnitude of the base-emitter voltage; which, of course, is only about 0.8 Volt.

In other words, the magnitude of the voltage developing across the primary winding of each saturable transformer is only about 0.2 Volt; which, of course, represents a magnitude that is totally negligible in comparison with the magnitude of the voltage developing between output terminals Oa and Ob.

Thus, the voltage at terminal Ob is substantially equal to the voltage at terminal Jb; and the voltage at terminal Oa is substantially equal to the voltage at terminal Ja.

(m) It is believed that the present invention and its several attendant advantages and features will be understood from the preceeding description. However, without departing from the spirit of the invention, changes may be made in its form and in the construction and interrelationships of its component parts, the form herein presented merely representing the presently preferred embodiment.

I claim:

1. An arrangement comprising:
 a DC source functional to provide a DC supply voltage between a first and a second DC supply terminal;
 an inverter circuit connected between the first and second DC supply terminals; the inverter circuit being functional to supply a high-frequency substantially sinusoidal AC output voltage between a first and a second AC output terminal; the high-frequency AC output voltage being of frequency several times higher than 60 Hz; any high-frequency AC voltage that might exist between the second AC output terminal and one of the DC supply terminals being of very small magnitude compared with the magnitude of the high-frequency AC output voltage; the inverter circuit being further characterized by including: (i) a first transistor having a first control input terminal, a first output terminal, and a first common terminal; and (ii) a second transistor having a second control input terminal, a second output terminal, and a second common terminal; the second output terminal being connected with the first common terminal, thereby to form a junction terminal; the junction terminal being connected with the first AC output terminal in such manner that: (i) substantially no unidirectional voltage drop can exist between the junction terminal and the first AC output terminal, and (ii) any alternating voltage existing between the junction terminal and the first AC output terminal is of very small magnitude compared with the magnitude of the high-frequency AC output voltage; a unidirectional voltage existing between the second common terminal and the first output terminal; the average magnitude of the unidirectional magnitude being substantially equal to that of the DC supply voltage; and
 a gas discharge lamp connected in circuit with the AC output terminals.

2. The arrangement of claim 1 wherein the inverter circuit is further characterized by being connected with the DC supply terminals by way of an inductor means.

3. An arrangement comprising:
 an AC source functional to supply an AC power line voltage at a pair of AC power line terminals;
 rectifying and filtering means connected with the AC power line terminals and functional to provide a DC supply voltage at a pair of DC supply terminals;
 a gas discharge lamp having lamp terminals; and
 an inverter-type ballasting circuit having DC input terminals connected with the DC supply terminals and AC output terminals connected with the lamp terminals; the inverter-type ballasting circuit being functional to power the gas discharge lamp and being otherwise characterized by: (i) having a first transistor with a first transistor terminal connected with a second transistor terminal of a second transistor; and (ii) causing a substantially sinusoidal AC voltage to exist between the first transistor terminal and one of the DC input terminals; the frequency of the substantially sinusoidal AC voltage being several times higher than that of the AC power line voltage.

4. The arrangement of claim 3 wherein a parallel-tuned L-C circuit is connected in circuit between the first transistor terminal and one of the DC input terminals; the parallel-tuned L-C circuit being naturally resonant at or near the fundamental frequency of the substantially sinusoidal AC voltage.

5. The arrangement of claim 3 wherein the DC source is additionally characterized by including circuitry operative to cause the absolute magnitude of the DC supply voltage to be larger than the absolute peak magnitude of the AC power line voltage.

6. The arrangement of claim 3 wherein the inverter-type ballasting circuit is further characterized in that: (i) the first transistor has a first control input terminal, a first output terminal, and a first common terminal; (ii) the second transistor has a second control input terminal, a second output terminal, and a second common terminal; (iii) the first. transistor terminal is the first transistor's common terminal; (iv) the second transistor terminal is the second transistor's output terminal.

7. The arrangement of claim 6 wherein the inverter-type ballasting means is yet further characterized in that: (i) a unidirectional voltage exists between the second transistor's common terminal and the first transistor's output terminal; and (ii) the absolute peak magnitude of the unidirectional voltage is larger than the absolute peak magnitude of the AC power line voltage.

8. An arrangement comprising:
an AC source functional to supply an AC power line voltage at a pair of AC power line terminals;
rectifying and filtering means connected with the AC power line terminals and functional to provide a substantially constant-magnitude DC supply voltage between a first and a second DC supply terminal;
an inductor means having a first winding and a second winding;
a lamp load having a pair of load terminals and including a series-combination of a gas discharge lamp and a current-limiting reactance means; and
an inverter circuit having: (i) a pair of AC output terminals connected with the load terminals and across which is provided an AC output voltage; (ii) a first terminal connected with the first DC supply terminal by way of the first winding; and (iii) a second terminal connected with the second DC supply terminal by way of the second winding.

9. The arrangement of claim 8 wherein the inverter circuit is further characterized by having a pair of transistors series-connected between the first terminal and the second terminal.

10. The arrangement of claim 8 wherein the rectifying and filtering means includes circuitry operative to cause the absolute magnitude of the DC supply voltage to be substantially higher than the absolute peak magnitude of the AC power line voltage.

11. The arrangement of claim 8 wherein the first winding and the second winding are magnetically coupled with each other.

12. The arrangement of claim 8 wherein the AC outout voltage has a substantially sinusoidal waveform.

13. The arrangement of claim 8 wherein the current-limiting reactance means is substantially a capacitive reactance.

14. An arrangement comprising:
an AC source functional to supply an AC power line voltage at a pair of AC power line terminals;
rectifying and filtering circuit connected with the AC power line terminals and functional to provide a filtered DC supply voltage between a first and a second DC supply terminal;
an inductor means having a first winding and a second winding;
a lamp load having a pair of load terminals; and
an inverter circuit characterized by: (i) having a pair of AC output terminals connected with the load terminals; (ii) providing a substantially sinusoidal AC output voltage across the AC output terminals; (iii) having a first terminal connected with the first DC supply terminal by way of the first winding; and (iv) having a second terminal connected with the second DC supply terminal by way of the second winding.

15. The arrangement of claim 14 wherein a pair of series-connected transistors is connected between the first terminal and the second terminal.

16. An arrangement comprising:
a first sub-circuit: (i) having AC power input terminals connected with an ordinary single-phase AC power line voltage, and (ii) being operative to provide a substantially constant-magnitude DC supply voltage between a first and a second DC supply terminal; the first sub-circuit having an electrically conductive path between one of the DC supply terminals and one of the AC power input terminals;
a second sub-circuit including an inductor means having a first winding and a second winding;
a lamp load having a pair of load terminals and including a series-combination of a gas discharge lamp and a current-limiting reactance means; and
a third sub-circuit circuit having: (i) a pair of AC output terminals connected with the load terminals and across which is provided an AC output voltage of frequency several times higher than that of the AC power line voltage; (ii) a first terminal connected with the first DC supply terminal by way of the first winding; and (iii) a second terminal connected with the second DC supply terminal by way of the second winding; a unidirectional voltage existing between the first terminal and the second terminal; the third sub-circuit also having a first and a second transistor series-connected between the first terminal and the second terminal; the two transistors being connected together at a common terminal; the average magnitude of the unidirectional voltage being substantially equal to that of the DC supply voltage.

17. The arrangement of claim 16 wherein the third sub-circuit is additionally characterized by having sufficient structure to cause a substantially sinusoidal AC voltage to exist between the common terminal and one of the DC supply terminals.

18. The arrangement of claim 16 wherein the third sub-circuit is additionally characterized in that the first transistor has a first transistor terminal connected to the first terminal and the second transistor has a second transistor terminal connected to the second terminal.

19. The arrangement of claim 16 wherein the first sub-circuit is additionally characterized by including sufficient structure to cause the absolute magnitude of the DC supply voltage to be distinctly higher than the absolute peak magnitude of the AC power line voltage.

20. The arrangement of claim 16 wherein the third sub-circuit is additionally characterized by having a third and a fourth transistor series-connected between the first terminal and the second terminal.

21. An arrangement comprising:
a first sub-circuit: (i) having AC power input terminals connectable with an ordinary single-phase AC power line voltage, and (ii) being operative to provide a substantially constant-magnitude DC supply voltage between a negative and a positive DC supply terminal; a first capacitor being connected between the negative DC supply terminal and a reference terminal; a second capacitor being connected between the positive DC supply terminal and the reference terminal;
a second sub-circuit including an inductor means having a first inductor winding and a second inductor winding;
a gas discharge lamp; and
a third sub-circuit circuit having: (i) a first terminal and a second terminal connected with the negative and the positive DC supply terminals by way of the first and the second inductor windings thereby to cause a unidirectional voltage to exist between the first terminal and the second terminal; the average magnitude of the unidirectional voltage being substantially equal to that of the DC supply voltage; (ii) a pair of transistors series-connected between the first terminal and the second terminal; (iii) the pair of transistors connected together at a joint terminal; (iv) sub-circuitry functional to cause a substantially sinusoidal AC voltage to exist between the joint terminal and the reference terminal; and (v) the gas discharge lamp connected in circuit with the joint terminal and the reference terminal.

22. The arrangement of claim 21 wherein the third sub-circuit is additionally characterized by including a tuned LC circuit connected with the joint terminal as well as with the reference terminal.

23. The arrangement of claim 21 wherein the first sub-circuit is additionally characterized in that: (i) it has an electrically conductive path between one of the DC supply terminals and one of the AC power input terminals; and (ii) it includes structure operative to cause the absolute magnitude of the DC supply voltage to be distinctly larger than the peak absolute magnitude of the AC power line voltage.

24. An arrangement comprising:
a first electronic assembly having AC power input terminals operable to connect with an AC power line voltage and, when indeed so connected, to provide a DC supply voltage of substantially constant magnitude between a pair of DC supply terminals; the first electronic assembly also having structure operative to cause the absolute magnitude of the DC supply voltage to be distinctly higher than the absolute peak magnitude of the AC power line voltage;
a gas discharge lamp having lamp terminals; and
a second electronic assembly having: (i) DC input terminals connected with the DC supply terminals; (ii) AC output terminals connected with the lamp terminals by way of a current-limiting reactance means, thereby to supply the gas discharge lamp with an alternating lamp current of frequency substantially higher than that of the AC power line voltage; and (iii) an inductor means and a capacitor means being effectively parallel-connected across the AC output terminals, thereby to form a parallel-tuned L-C circuit resonant at or near the frequency of the alternating lamp current.

25. The arrangement of claim 24 wherein the first electronic assembly is additionally characterized by including structure functional, at least periodically, to cause an electrically conductive path to exist between one of the DC supply terminals and one of the AC power input terminals.

26. The arrangement of claim 24 wherein the second electronic assembly is additionally characterized by including a transistor as well as other structure connected with the DC input terminals in such manner as to cause the transistor to be subjected to a voltage of peak absolute magnitude in excess of the peak absolute magnitude of the AC power line voltage; the transistor alternating, at a frequency equal to that of the lamp current, between being conductive and being non-conductive.

27. The arrangement of claim 24 wherein the second electronic assembly includes at least one periodically conducting semiconductor, but does not include a periodically conducting thyristor.

28. The arrangement of claim 24 wherein the second electronic assembly is additionally characterized by having structure functional to cause it to draw a unidirectional current from the DC supply terminals by way of an inductor means.

29. The arrangement of claim 28 wherein the second electronic assembly is yet additionally characterized by including: (i) a pair of transistors, (ii) structure functional to cause the transistors to conduct in an alternating manner, and (iii) a parallel-tuned LC circuit; the alternatingly conducting transistors being operative to convert the unidirectional current to an alternating current; which alternating current is then being supplied to the parallel-tuned LC circuit.

30. An arrangement comprising:
a first electronic assembly having AC power input terminals operable to connect with an AC power line voltage and, when indeed so connected, to provide a DC supply voltage of substantially constant magnitude between a pair of DC supply terminals;
a gas discharge lamp having lamp terminals; and
a second electronic assembly having: (i) DC input terminals connected with the DC supply terminals; (ii) a pair of transistors connected together at a junction terminal; (iii) a pair of output terminals; (iv) structure sufficient to cause (a) the transistors to conduct alternatingly, (b) to cause a first substantially sinusoidal voltage to exist between the junction terminal and one of the DC supply terminals, and (c) to cause a second substantially sinusoidal voltage to exist between the output terminals; and (v) sub-circuitry connected between the output terminals and the lamp terminals, thereby to provide power to the gas discharge lamp.

31. The arrangement of claim 30 further characterized in that the two transistors are series-connected between a first terminal and a second terminal.

32. An arrangement comprising:
a first electronic assembly having AC power input terminals connected with an AC power line voltage and being functional to provide a DC supply voltage between a negative DC supply terminal and a positive DC supply terminal;
a gas discharge lamp having lamp terminals; and
a second electronic assembly having:
(i) DC input terminals connected with the DC supply terminals;
(ii) a pair of transistors connected together at a junction terminal;
(iii) a pair of output terminals;
(iv) structure functional (a) to connect the transistors in circuit with the DC input terminals, (b) to cause the transistors to conduct alternatingly, (c) to cause a substantially sinusoidal voltage to exist between the junction terminal and one of the DC supply terminals, and (d) to cause a substantially sinusoidal voltage to exist between the output terminals; and
(v) sub-structure connected between the output terminals and the lamp terminals, thereby to provide power to the gas discharge lamp.

33. An arrangement comprising:
a source operative to provide, between a first and a second DC terminal, a DC voltage of substantially constant magnitude;
an inverter circuit connected with the DC terminals and functional to provide an inverter AC voltage between a reference terminal and an inverter output terminal; the inverter AC voltage being of frequency several times higher than 60 Hz and otherwise characterized in having a waveshape consisting of sinusoidally-shaped voltage pulses of alternating polarity; the inverter circuit including a tuned L-C circuit connected in circuit with the inverter output terminal and the reference terminal; the L-C circuit having a tank capacitor parallel-connected with a tank inductor and being resonant at or near the frequency of the inverter AC voltage; the inverter circuit being further characterized in that: (i) it includes a first intermittently conducting transistor having a first transistor terminal connected with the inverter output terminal in such manner that no voltage of substantial magnitude can exist between the transistor terminal and the inverter output terminal, the term substantial magnitude being defined as a magnitude larger than one tenth the magnitude of the inverter AC voltage; (ii) any AC voltage, of frequency equal to that of the inverter AC voltage, existing between the reference terminal and the first DC terminal is of negligible magnitude compared with the magnitude of the inverter AC voltage; and (iii) any AC voltage, of frequency equal to that of the inverter AC voltage, existing between the first and second DC terminals is of negligible magnitude compared with the magnitude of the inverter AC voltage; and
gas discharge lamp means connected in circuit with the L-C circuit.

34. The arrangement of claim 33 wherein the inverter circuit is additionally characterized by including a second transistor having a second transistor terminal; the second transistor terminal being connected with the first transistor terminal in such manner than no voltage of substantive magnitude can exist therebetween.

35. An arrangement comprising:
a source operative to provide, between a first and a second DC terminal, a DC voltage of substantially constant magnitude;
an inverter circuit connected with the DC terminals and functional to provide an inverter AC voltage between a reference terminal and an inverter output terminal; the inverter AC voltage being of frequency several times higher than 60 Hz and otherwise characterized in having a waveshape consisting of sinusoidally-shaped voltage pulses of alternating polarity; the inverter circuit including a tuned L-C circuit connected in circuit with the inverter output terminal and the reference terminal; the L-C circuit having a tank capacitor parallel-connected with a tank inductor and being resonant at or near the frequency of the inverter AC voltage; the inverter circuit being further characterized in that it includes two alternatingly conducting transistors series-connected between two auxiliary terminals between which exists a unidirectional voltage consisting of sinusoidally-shaped unidirectional voltage pulses, and having an average magnitude substantially equal to that of the DC voltage.

36. An arrangement comprising:
a source providing, between a first and a second DC supply terminal, a constant-magnitude DC supply voltage;
an inverter circuit having a pair of AC output terminals as well as a first and a second DC input terminal;
inductor means having a first winding and a second winding; the first winding being connected between the first DC supply terminal and the first DC input terminal; the second winding being connected between the second DC supply terminal and the second DC input terminal; and
output means connected with the AC output terminals; the output means having lamp output terminals adapted to connect with a gas discharge lamp.

37. The arrangement of claim 36 wherein the inverter circuit is further characterized by having a pair of transistors series-connected between the first and second DC input terminals.

38. The arrangement of claim 36 additionally characterized by: (i) one of the transistors having a transistor terminal; and (ii) the presence of a substantially sinusoidal voltage between said transistor terminal and one of the DC supply terminals.

* * * * *